United States Patent [19]

Kuramochi et al.

[11] 4,386,175

[45] May 31, 1983

[54] RESIN COMPOSITION

[75] Inventors: Hiroshi Kuramochi; Noriaki Nakajo; Makoto Abekura; Jun Matsumoto, all of Ina, Japan

[73] Assignee: Kokoku Rubber Industrial Company Limited, Japan

[21] Appl. No.: 117,438

[22] Filed: Feb. 1, 1980

[30] Foreign Application Priority Data

Feb. 8, 1979 [JP] Japan .................................. 54-12770
Feb. 8, 1979 [JP] Japan .................................. 54-12771

[51] Int. Cl.$^3$ ...................... C08L 23/16; C08L 23/04; C08L 25/06; C08L 35/06
[52] U.S. Cl. ........................................ 524/32; 156/646; 156/668; 252/79.1; 524/52; 524/392; 524/515; 524/518; 524/521; 524/525; 524/526; 524/528
[58] Field of Search ..................... 260/42.47; 252/79.1; 156/646, 668; 524/515, 518, 521, 525, 526, 528, 32, 52, 392

[56] References Cited

U.S. PATENT DOCUMENTS

| | | | |
|---|---|---|---|
| 3,562,118 | 2/1971 | Baier et al. | 156/668 |
| 3,563,784 | 2/1971 | Innes et al. | 156/668 |
| 3,871,929 | 3/1975 | Schevey et al. | 252/79.1 |
| 3,937,683 | 2/1976 | Ferrar | 260/42.47 |
| 4,002,595 | 1/1977 | Adelman | 260/42.47 |
| 4,098,734 | 7/1978 | Lee | 260/17 R |

*Primary Examiner*—Wilbert J. Briggs, Sr.

[57] ABSTRACT

This invention relates to a resin composition characterized in that a conventional chemical etching treatment is removed and instead of it a surface of the resin composition is plated with a metallic layer having a strong adhesive force, by means of a surface treatment by only a dry etching. Accordingly, the surface thereof can be directly treated with electroplating. Further, the use of chromic acid as a source of environmental pollution or other conventional addition agents for the surface treatment is completely eliminated.

7 Claims, No Drawings

RESIN COMPOSITION

BACKGROUND OF THE INVENTION

This invention relates to a resin composition characterized in that a resin compound in which a rubber material is compounded can be directly treated with electroplating, the resin composition being suitable particularly for injection molding.

Today, plated plastic products are being used widely for electrical parts, auto parts, etc. The most part of those plastic products are made of ABS resins. The ABS resin i.e. acrylonitrile-butadiene-styrene copolymer has various types of properties.

Conventionally, in order to provide an ABS resin with a surface treatment appropriate for plating, first a conductive layer is formed on a surface of the ABS resin by means of electroless plating, and next electroplating is applied using a preferred plating material. This process is also used for polypropylene, polyvinyl chloride or the like. The electroless plating in the first stage provides a conductive layer on the surface of the ABS resin by separating copper or nickel chemically, and has a very important function for guaranteeing a high quality product. The electroless plating requires a long process, that is, degreasing→etching→catalytic process→acceleration→separating of electroless nickel or electroless copper, so that stringent liquid control and treatment are urged. For this reason, the inconvenience of the conventional process is that there may occur some bad products or unnecessarily raising the cost.

Usually, the process of this electroless plating adopts exclusively a so-called chemical etching process in which a chemical etching agent is a mixture of a high-density anhydrous chromic acid and sulfuric acid.

The mixture containing the anhydrous chromic acid has very strong oxidation particularly for the ABS resins, whilst it causes a mist since it is employed under the conditions of high density and high temperature. Because the mixture of anhydrous chromic acid is extremely poisonous for the human body, its handling and treatment require great care. Particularly, it has been clarified that release of hexahydric chrome waste produces serious environmental pollution. In order to avoid the above defects, this invention has been attained.

BRIEF SUMMARY OF THE INVENTION

It is therefore a basic object of this invention to provide a resin composition characterized in that the need for a conventional chemical etching treatment using chromic acid or other addition agents for a surface treatment is eliminated and instead, a new dry etching treatment is employed, whereby conventional electroless plating is completely eliminated.

Other and further objects, features and advantages of this invention will appear more fully from the following description.

DETAILED DESCRIPTION OF THE INVENTION

Conventionally, ABS resin has been used mainly as a substrate resin for plating. Because plastic materials other than the ABS resin-made material require a particular etching treatment, additional costs are incurred in their use. Secondly, plated products made of ABS resin have satisfied requirements of users.

The resin composition according to this invention is not limited to ABS resin, but also may include other thermoplastic resins or a preferred thermoplastic resin containing a rubber material.

As mentioned above, the resin composition according to this invention employs a new dry etching treatment, more particularly a plasma oxide treatment. Namely, the resin composition according to this invention is obtained by mixing a preferred thermoplastic resin with an addition agent effective to cause a certain hydrophilic nature or a polar group due to the plasma oxidation.

In case ABS resin is used, this plasma oxidation is due to oxidation of a butadiene ingredient having an unsaturated bond and causes a polar group. Subsequently, the surface of the ABS resin becomes hydrophilic and roughened so that it contributes greatly to a strong adhesion in electroplating. For generating plasma, oxygen gas is effective, but organic peroxide, air, vapor, nitrogen, etc. are ineffective.

A plasma generator which is a product of International Plasma Corporation is used wherein oxygen gas is supplied under a reduced pressure of 0.01 to 0.3 Torr. Under the conditions of oxygen flow 50 to 150 cc/min. (about 0.3 to 0.5 Torr), plasma output 50 to 150 W and treating time 5 to 15 min., a plasma treatment by oxygen gas was carried out. The treatment conditions are variable by capacity, treating volume, etc. of the plasma generator, but not limited. The result of the foregoing treatment was that a considerably strong adhesion was obtained.

When treating a thermoplastic resin product with electroplating, it has often been pointed out that it is easier to cause peeling due to some difference of a treatment temperature and some difference of the rate of thermal expansion between a plastic material and a metal etc. To avoid such a disadvantage, it is suitable to carry out a supplementary treatment. Even if the etching is not perfect in the stage of plasma treatment, the surface treatment can be assisted by the following supplementary solvents: Hcl, $HNO_3$, $H_2SO_4$, $H_2O_2$, $KMnO_4$, NaClO, $Na_2O_5$, $P_2O_5$, etc.

Those acids or oxidizing agents are of less toxicity and less smell, so that their waste disposal is easy. Needless to say, it is a user's option to use either a single agent out of them or two or more out of them in combination under the condition of a relatively low density and low temperature.

As will be described hereinafter, in our experiment, $H_2SO_4$ and $H_2O_2$ are the main supplementary agents and are basically treated under a treatment temperature 30°–40° C. and a treatment time 10 minutes.

A metallizing treatment for a material made of an improved resin composition according to our experiment removes the use of chromic acid for the etching treatment. Namely, the rough surface of the improved resin composition according to our experiment is formed into a conductive surface by electroless plating. Following this, a preferred metallizing treatment for the rough surface may be carried out by electroplating using various plating materials, spattering or ion plating.

A metallic layer formed by the above metallizing process has excellent adhesion and external appearance compared to a metallic layer formed by the conventional chemical etching using a mixture of chromic acid.

Preferred experiments of the improved resin compositions which are actually used for the metallizing will now be described.

One or more addition agents which cause hydrophilic nature and polar group is or are blended to a basic material; ABS resin or polypropylene. By mixing the basic material with such an addition agent as to cause a hydrophilic nature and a polar group, we have reformed the above two basic materials so as not to deteriorate the properties thereof. As a result, we found that the following combination is desirable.

A mixture in which 100 parts by weight of ABS resin or polypropylene resin are mixed with from 5 to 30 parts by weight of at least one out of the following addition agents, or from 5 to 30 parts by weight of two blends or more out of the following addition agents: (1) metal oxide such as magnesium oxide, zinc oxide, etc. or (2) metal hydroxide such as magnesium hydroxide, calcium hydroxide, etc. or (3) a mixture of metallic salt such as calcium carbonate and talc containing metallic salt or (4) polycarbonate resin or epoxy resin containing bisphenol (5) anhydrous organic acid such as maleic anhydride, phthalic anhydride, etc.

Thus, an improved resin composition has been obtained. Further, in order to enhance its moldability, mechanical strength and dispersion of fillers, it may be possible to add a lubricant, an agent for preventing oxidation, a coloring agent, a stabilizer, a nonflammable agent, a reinforcing agent, etc.

Now, three experiments of the improved resin compositions will now be described.

| Experiment 1. | |
|---|---|
| [Improved resin composition] | Parts by weight |
| Diapet 3001M (Product name of ABS resin by Mitsubishi Rayon Co., Ltd.) | 100 |
| Maleic anhydride } Addition agent | 15 |
| Stearic acid | 1 |

The mixture of the above compositions was heated for ten minutes at 160° C. by means of a roll mill and modified into a sheet form by means of an injection molding machine. Thus, an improved resin composition was obtained.

| Experiment 2 | |
|---|---|
| [Improved resin composition] | Parts by weight |
| STYLAC (Product name of ABS resin by Asahi Dow Co., Ltd.) | 100 |
| ZnO (Addition agent) | 30 |

In the same way as mentioned in Experiment 1, an improved resin composition was obtained.

| Experiment 3 | |
|---|---|
| [Improved resin composition] | Parts by weight |
| Noblen (Product name of polypropylene resin of Mitsubishi Petrochemical | 100 |

-continued

| Experiment 3 | |
|---|---|
| [Improved resin composition] | Parts by weight |
| Co., Ltd.) | |
| Butyl rubber | 20 |
| Calcium carbonate (Addition agent) | 30 |

In the same way as mentioned in Experiment 1, an improved resin composition was obtained.

The following is a process of metallizing of the improved resin composition.

(1) Plasma treatment by oxygen gas:
Output 50 W
Oxygen gas flow 50 cc/min.
Processing time 10 min.

(2) Chemical treatment (applied only for the improved resin composition in Experiment 2):
Composition of treatment agents:
$H_2O_2$ 400 ml, $H_2SO_4$ 200 ml,
$H_3PO_4$ 100 ml, $H_2O$ 300 ml
Treatment temperature: 40° C.
Treatment time: 10 min.

(3) Catalyst:
Composition: Catalyst made by Daiwa Tokushu Kagaku Co., Ltd.
(Crude liquid) 1:(Hcl) 1:($H_2O$) 4
Treatment temperature: 40° C.
Treatment time: 5 min.

(4) Acceleration:
Composition: $H_2SO_4$ (Aqueous solution 3%)
Treatment temperature: 40° C.
Treatment time: 0.5 min.

(5) Electroless nickel plating:
Treatment temperature: 40° C.
Treatment time: 10 min.

(6) Electrolytic copper plating: $30\mu$

A thin layer $30\mu$ by the above electrolytic copper plating showed adhesive force of 0.8 to 1.5 Kg./cm. An external appearance of the plated surface was smooth. Although a thermal shock test was performed, no abnormal phenomenon was found.

The improved resin composition as described above is characterized in that the use of chromic acid was eliminated, but it still requires a chemical etching treatment, that is, a supplementary treatment by mixture of a preferred addition agent.

The basic object of this invention is to remove such a chemical etching treatment.

Preferred examples of the resin composition according to this invention will be described in detail hereinafter, but we will describe one of the experiments that has been conducted until this invention has been completed.

| Experiment 4 | |
|---|---|
| | Parts by weight |
| NOBLEN (Product name of polypropylene resin by Mitsubishi Petrochemical Co., Ltd.) | 100 |
| Ketjen Black EC (Product name of carbon black by Akzo Ltd.) | 30 |
| Polynorbornene rubber | 30 |

The mixture comprising the above materials was mixed together for 30 minutes under the application of heat at 180° C. by means of a roll mill, and then the improved resin composition was obtained. Next to this, the following treatments for the purpose of metallizing a surface of the above resin composition were carried out: (1) Plasma treatment by oxygen gas, (2) chemical etching and (3) electrolytic copper plating.

The details of the above treatments were the same as those of the previous experiments described on Page 10 and 11 of this Specification.

In the above experiment, metallizing had to be also assisted by the chemical etching treatment.

Now, the resin composition of this invention will be described. As described previously, in this invention the need for such a chemical etching treatment is eliminated and instead the resin composition thereof is plated with metallic layer having a strong adhesion, using means of a surface treatment by only dry etching. More particularly, the resin composition of this invention is characterized in that 100 parts by weight of a basic material comprising a thermoplastic resin and a rubber material are mixed with from 15 to 40 parts by weight of carbon black, from 0.1 to 20 parts by weight of a water-soluble organic material and/or from 0.5 to 5 parts by weight of surface-active agent, whereby the resin composition is provided with volume resistivity of no more than $10^1$ ohm cm and is particularly suitable for injection molding.

A thermoplastic resin is preferably selected from polypropylene (homopolymer or copolymer), polyethylene (low-density or medium/or high-density), polystyrene (for a general purpose or impact resistance) and acrylonitrile-butadiene-styrene i.e. ABS for a general purpose. The basic material contains a rubber material, preferably a thermoplastic resin, in an amount of from 60 to 90 parts by weight. If the amount is less than 60 parts by weight, the basic material becomes inferior in its hardness and flow characteristics. On the other hand, if the amount is more than 90 parts by weight, the basic material's mechanical properties are extremely deteriorated.

The rubber material is preferably selected from ethylene-propylene-diene terpolymer (EPDM), nitrilebutadiene rubber (NBR), styrenebutadiene rubber (SBR) and polynorbornene rubber (PNR). The rubber material aims at preventing deterioration of the mechanical properties of the thermoplastic resin and obtaining a strong adhesion. The rubber material is preferably used in an amount of from 10 to 40 parts by weight. If the amount is out of this range, the resin composition will be greatly deteriorated in view of its mechanical properties, injection moldability, quality of plating, etc.

A carbon black has preferably smaller granules in diameter but larger surface area. Therefore, either acetylene black having high oil absorption or furnace black having good conductivity is suitable. Thus, the basic material is provided with conductivity. A carbon black is preferably used in an amount of from 15 to 40 parts by weight, based on 100 parts by weight of the basic material. If the amount is no more than 15 parts by weight, a preferred volume resistivity of the resin composition according to this invention, does not reach a $10^1$ ohm cm level. For this reason, the quantity of electricity necessary for electroplating is not flowing sufficiently. Then, the electroplating is delayed remarkably. If the amount is no less than 40 parts by weight, the volume resistivity of the resin composition reaches a 10 ohm cm whereby a good deposition of electroplating is obtained but the mechanical properties as well as injection moldability are deteriorated.

A water-soluble organic material is a substance having a polar group such as —OH, —COOH, —NH$_2$, etc. It is divided into two categories, that is, a high polymeric substance such as polyvinyl alcohol, polyethylene glycol, starch, polyacrylic acid, methylcellulose, etc. and a low-molecular substance such as glycerin, diethylene glycol, etc. Any one of these has the effect to enhance acceleratively adhesive force of the rubber content.

A water soluble organic material is preferably used in an amount of from 0.1 to 20 parts by weight, based on 100 parts by weight of the basic material. If the amount is no more than 0.1 parts by weight, such effect is not attained. Further, if the amount is no less than 20 parts by weight, the physical properties of the resin composition are deteriorated.

A surface-active agent is selected from cationic, anionic and nonionic surface-active agents. When it is preferably used in an amount of from 0.5 to 5 parts by weight, based on 100 parts by weight of the basic material, the latter becomes hydrophilic easily and its deposition rate is expedited.

Thus, the polyvinylalcohol material and the polyethylene glycol material have the effect to reinforce the plate adhesion. If the above amount is no more than 0.5 parts by weight, the plate adhesion becomes ineffective. If the amount is more than 5 parts by weight, it is easy to cause bleeding.

Further, it is possible to add to the resin composition according to this invention an antioxidation agent, an ultraviolet-rays-absorption agent, a heat stabilizer, a lubricant, a plasticizer, a filler and the like as necessary.

According to one aspect of this invention, almost all thermoplastic resins can be treated with plating. And the plated products are of a high quality. Further, since anhydrous chromic acid is not used, a safety plating is established.

Preferred examples of this invention will now be described.

EXAMPLE 1

TABLE 1

| Materials | Brand Name/Remark | Parts by weight |
|---|---|---|
| High-density polyethylene | HIZEX 1500J (Made by Mitsui Petrochemical Ind. Ltd.) | 70 |
| Ethylene-propylene-diene terpolymer (EPDM) | ESPREN 505 (Made by Sumitomo Chemical Co.) | 30 |
| Carbon Black | PENTAC EBX (Made by Toyo Kakoken Kogyo Ltd.) | 25 |
| Polyethylene glycol | # 6000 | 1 |
| Polyvinylalcohol | Polymerization degree 500 | 1 |
| Stearic acid | — | 1 |

The materials as listed in Table 1 are mixed together under the application of heat at 130° C. by means of a mixing roll, and then a sheet-type resin composition A is formed by an injection molding machine.

Under the following conditions, the resin composition A is provided with a plasma treatment by oxygen gas, and a surface thereof is roughened and formed into a hydrophilic one.

Treatment conditions:

O₂ flow: 50 cc/min.
Output: 150 W
Treating time: 10 min.

After this process, the resin composition is treated with an ordinary electrolytic copper plating and a plated layer of 30μ is formed.

When the plated layer of the resin composition was partially severed with a 10 mm length and peeled, its adhesive force was 1.5 Kg./cm.

EXAMPLE 2

TABLE 2

| Materials | Brand Name/Remarks | Parts by weight |
|---|---|---|
| Polypropylene | NOBLEN MA-3 (Made by Mitsubishi Petrochemical Co., Ltd.) | 80 |
| EPDM (as above) | ESPREN 505 | 15 |
| Polynorbornene rubber (PNR) | NORSOREX (Made by CdF Chimie S.A.) | 5 |
| Carbon Black | PENTAC EBX | 30 |
| PEG (as above) | # 4000 | 15 |
| Surface-active agent | DUSPAR 25A (Made by Miyoshi Oil & Fat Co.) | 0.5 |
| Stearic acid | — | 1 |

The materials as listed in Table 2 are mixed together under the application of heat at 170° C. by means of the mixing roll, and then a sheet-type resin composition is formed by the injection molding machine.

Under the following conditions, the resin composition is provided with a plasma treatment by oxygen gas as described in the Example 1.

Treatment conditions:
O₂ flow: 100 cc/min.
Output: 50 W
Treating time: 10 min.

Likewise, a plated layer of 30μ is formed by the electrolytic copper plating. The testing result of adhesive force of the plated layer was 2.1 Kg./cm. The testing condition was the same as above.

EXAMPLE 3

TABLE 3

| Materials | Brand Name/Remarks | Parts by weight |
|---|---|---|
| General-purposed polystyrene | STYRON 666 (Made by Asahi Dow Co.) | 60 |
| Nitrilebutadiene rubber | Hycar 1052J (Made by Nippon Zeon Co.) | 40 |
| Carbon Black | Ketjen black EC (Made by Lion Akzo Ltd.) | 20 |
| PEG (as above) | # 1500 | 10 |
| Surface-active agent | TB-160 (Made by Matsumoto Yushi Seiyaku Co.) | 1 |
| Lubricant | Vanfre AP-2 | 5 |
| Anti-aging agent | # 200 | 1 |
| Stearic acid | — | 1 |

The materials as listed above in Table 3 are mixed together under the application of heat at 150° C.

The conditions of the plasma treatment are the same as those in the Example 2. The testing result of adhesive force of the plated layer of 30μ was 1.2 Kg./cm. The testing condition was the same as above.

EXAMPLE 4

TABLE 4

| Material | Brand Name/Remarks | Parts by weight |
|---|---|---|
| Acrylonitrile-butadiene-styrene | JSR 35 (Made by Nippon Synthetic Rubber Co.) | 20 |
| Polyvinylchloride | ZEON 103EP (Made by Nippon Zeon Co.) | 70 |
| NBR (as above) | HYCAR 1052J | 10 |
| Carbon Black | PENTAC EBX | 20 |
| PEG (as above) | # 1500 | 5 |
| Starch | — | 2 |
| Lubricant | Vanfre AP-2 | 5 |
| Heat stabilizer | Dibutyltin dilaurate | 2 |
| Anti-aging agent | # 200 | 1 |
| Stearic acid | — | 1 |

Likewise, the above materials are mixed together under the application of heat at 150° C. After that, the same plasma treatment is carried out. The testing result of adhesive force of the plated layer was 1.1 Kg./cm.

EXAMPLE 5

The resin composition which was obtained in the Example 2 was formed into a molded piece by means of an injection molding machine. A plasma treatment by oxygen gas (under the conditions of O₂ flow 100 cc/min., Output 50 W, Treating time 10 minutes) was applied to a surface of the molded piece. And the surface became rough and hydrophilic. Then, a normal electroplating by strike nickel, nickel and chrome was carried out. The plated piece passed the following thermal shock test. Namely, it was kept in an oven for one hour at 70° C. and then immediately kept in a refrigerator for one hour at −30° C. Such a test was repeated three times, but neither crack nor peeling of the plated layer occurred. The plated layer remained normal and excellent.

EXAMPLE 6

Likewise, the resin composition which was obtained in the Example 3 was formed into a molded piece by means of an injection molding machine. The same plasma treatment and the same electroplating as above were carried out.

Further, the same thermal shock test as above was done. It was repeated three times, but neither crack of the plate layer nor its peeling occurred. It remained normal and excellent.

Further, if alloy plating using tin or cobalt instead of chrome plating is carried out, a completely non-polluted plating may be attained.

We have described in detail the background of this invention and several experiments which have been conducted until a resin composition of this invention has been achieved.

As described previously, a resin composition of this invention is characterized in that a conventional chemical etching treatment is totally removed and instead of it a surface of the resin composition is plated with a metallic layer having a strong adhesive force, by means of a surface treatment by only a dry etching. Accordingly, the surface thereof can be directly treated with electroplating. Further, the use of chromic acid as a source of environmental pollution or other conventional addition agents for assisting the surface treatment is removed completely.

What is claimed is:

1. A resin composition, comprising a mixture of 100 parts by weight of a basic material containing from about 60 to about 90 parts by weight of a thermoplastic resin selected from the group consisting of polypropylene, polyethylene, polystyrene and acrylonitrile-butadiene-styrene and from about 10 to about 40 parts by weight of a rubber material selected from the group consisting of ethylene-propylene-diene terpolymer, nitrilebutediene rubber, styrenebutediene rubber, and polynorbornene rubber and from 15 to 40 parts by weight of a carbon black mixed with an effective amount of an addition agent containing at least one of a water-soluble organic material and a surface-active agent, said effective amount of an addition agent being capable of enhancing dry etching of a surface of said composition by a gas plasma contacting said surface, said dry etching being effective to permit adhesion of a plating on said surface.

2. A resin composition as claimed in claim 1, wherein the plasma is effective for oxidation of said surface.

3. A resin composition as claimed in claim 1 or claim 2, wherein the water-soluble organic material is used in an amount of from 0.1 to 20 parts by weight and the surface-active agent is used in an amount of from 0.5-5 parts by weight, whereby the resin composition is provided with volume resistivity of no more than $10^1$ ohm cm and is suitable for injection molding.

4. A resin composition as claimed in claim 1, wherein the carbon black is selected from the group consisting of a high-structured acetylene black and a conductive furnace black.

5. A resin composition as claimed in claim 3, wherein the water-soluble organic material is selected from one of the group consisting of a high polymeric substance and a low-molecular substance.

6. A resin composition as claimed in claim 5, wherein said high polymeric substance includes one of polyvinyl alcohol, polyethylene glycol, starch, polyacrylic acid and methylcellulose.

7. A resin composition as claimed in claim 5, wherein said low-molecular substance includes one of glycerin and diethylene glycol.

* * * * *